United States Patent
Ice (10) Patent No.: US 7,370,414 B2
(45) Date of Patent: May 13, 2008

(54) METHODS FOR MANUFACTURING LEAD FRAME CONNECTORS FOR OPTICAL TRANSCEIVER MODULES

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 351 days.

(21) Appl. No.: 10/810,041

(22) Filed: Mar. 26, 2004

(65) Prior Publication Data

US 2005/0188535 A1  Sep. 1, 2005

Related U.S. Application Data

(60) Provisional application No. 60/548,257, filed on Feb. 27, 2004.

(51) Int. Cl.
*H01R 43/00* (2006.01)
(52) U.S. Cl. .............. 29/883; 29/882; 29/884; 29/874; 29/827; 439/79; 439/736
(58) Field of Classification Search .......... 29/882–884, 29/874–879, 827, 829, 564.2–564.6; 439/79, 439/736, 516; 385/88–93; 264/272.14–272.17
See application file for complete search history.

(56) References Cited

U.S. PATENT DOCUMENTS

| | | | |
|---|---|---|---|
| 4,471,158 A | | 9/1984 | Roberts |
| 4,593,463 A | * | 6/1986 | Kamono et al. ............. 29/884 |
| 4,689,023 A | | 8/1987 | Strong, III et al. |
| 5,295,214 A | | 3/1994 | Card et al. |
| 5,619,794 A | * | 4/1997 | Hokazono .................. 29/883 |
| 5,632,630 A | | 5/1997 | Card et al. |
| 5,768,777 A | * | 6/1998 | Lemke ....................... 29/882 |
| 6,086,413 A | | 7/2000 | Karasik et al. |
| 6,125,535 A | * | 10/2000 | Chiou et al. ................ 29/883 |
| 6,488,534 B2 | | 12/2002 | Soga et al. |
| 6,527,571 B2 | | 3/2003 | Muta et al. |
| 6,588,100 B2 | * | 7/2003 | Ma et al. ..................... 29/882 |
| 6,652,294 B1 | | 11/2003 | Zhang |
| 6,668,897 B2 | | 2/2004 | Korsunsky et al. |
| 6,764,336 B2 | | 7/2004 | Ma et al. |
| 6,764,338 B2 | | 7/2004 | Fang |
| 6,796,852 B2 | | 9/2004 | Okamoto |
| 6,817,782 B2 | | 11/2004 | Togami et al. |
| 6,922,231 B1 | | 7/2005 | Wang et al. |
| 7,097,468 B2 | * | 8/2006 | Ice ............................. 439/79 |
| 2003/0026081 A1 | | 2/2003 | Liu et al. |

* cited by examiner

*Primary Examiner*—Minh Trinh
(74) *Attorney, Agent, or Firm*—Workman Nydegger (57) ABSTRACT

Methods of manufacturing lead frame connectors for use in connecting optical sub-assemblies to printed circuit boards in optical transceiver modules. The lead frame connectors are formed by first stamping a selected configuration of conductors in a conductive ribbon. The conductors are bent as necessary and passed in a reel-to-reel manner through an insert injection molding process to form an electrically insulating casing about the conductors. After the molding process, the ribbon is singulated to obtain individual lead frame connectors. The individual conductors encased in the casing can be electrically separated by punching out a connecting conductive structure through a hole formed in the casing. The connecting conductive structure mechanically secures the conductors to each other during the molding process and, when punched out, substantially eliminate stubs that could otherwise degrade the RF performance of the lead frame connectors.

13 Claims, 5 Drawing Sheets

FIG. 6

METHODS FOR MANUFACTURING LEAD FRAME CONNECTORS FOR OPTICAL TRANSCEIVER MODULES

RELATED APPLICATION

This application claims the benefit of U.S. Provisional Patent Application Ser. No. 60/548,257, filed Feb. 27, 2004, which is incorporated herein by reference.

BACKGROUND OF THE INVENTION

1. The Field of the Invention

The present invention relates generally to optical transceiver modules. More specifically, the present invention relates to methods of manufacturing lead frame connectors used to connect an optical sub-assembly to a printed circuit board in an optical transceiver module.

2. Background and Relevant Art

Optical transceivers are used to transmit and receive optical signals from an optical network and to enable electrical network components to interface with and communicate over optical networks. Many optical transceivers are modular and are designed in accordance with industry standards that define mechanical aspects of the transceivers, form factors, optical and electrical requirements, and other characteristics and requirements of the transceivers. For example the Small Form-Factor Module Multi-Source Agreement (SFF MSA), the Small Form-Factor Pluggable Module Multi-Source Agreement (SFP MSA) and the 10 Gigabit Small Form Factor Pluggable Module Multi-Source Agreement (XFP MSA) Revision 3.1 define such standards and are incorporated herein by reference.

The basic optical components of conventional transceivers include a transmitter optical sub-assembly (TOSA) and a receiver optical sub-assembly (ROSA). The TOSA receives electrical signals from a host device via circuitry of the transceiver module and generates a corresponding optical signal that is then transmitted to a remote node in an optical network. Conversely, the ROSA receives an incoming optical signal and outputs a corresponding electrical signal that can then be used or processed by the host device.

The electrical connections between the optical sub-assemblies and a printed circuit board (PCB) in the transceiver module have various electrical and mechanical requirements. One of the most common electrical connection components used in conventional optical transceiver modules is a flexible printed circuit board, or "flex circuit," that connects the rigid printed circuit board of the module to leads associated with the TOSA or ROSA. Flex circuits have several advantages, including good electrical performance and radio frequency response and the ability to take up tolerances in the modules and to withstand stresses that arise during manufacture and operation of the modules. Examples of flex circuits used in optical transceiver modules are described in U.S. patent application Ser. No. 10/409,837, filed Apr. 9, 2003, which is incorporated herein by reference. The foregoing patent application also illustrates other components of optical transceiver modules, such as TOSAs and ROSAs, and includes other general information regarding optical transceiver modules that is useful as background material for the invention described herein.

While flex circuits have been widely used in recent years in optical transceiver modules, flex circuits represent a significant portion of the costs and labor required to manufacture transceiver modules. As the price of transceiver modules drops, the costs associated with flex circuits continue to represent an increasing proportion of the overall costs of transceiver modules.

Other approaches to connecting optical sub-assemblies to printed circuit boards have been introduced in recent years. For example, the leads protruding from TOSAs and ROSAs can be bent into a configuration that enables the leads to be directly soldered or otherwise connected to the printed circuit board. This technique is often less expensive than the use of flex circuits, but can lead to unfavorable RF response due to the inability to carefully control impedances. In addition, machining leads of TOSAs and ROSAs introduces reliability risks due to the likelihood of damaging glass or other fragile portions of header assemblies in TOSAs and ROSAs that enclose the lasers and photodetectors, respectively.

Because of the possibility of damaging the TOSAs and ROSAs and poor electrical performance, bending leads to enable the optical sub-assemblies to be directly connected to the printed circuit board is not suitable for many transceiver modules. This approach is particularly unsuitable for relatively high-speed transceiver modules, in which the RF response of the conductors is more important.

BRIEF SUMMARY OF EMBODIMENTS OF THE INVENTION

The present invention relates to lead frame connectors that are used to electrically and mechanically connect optical sub-assemblies to printed circuit boards in optical transceiver modules. The lead frame connectors enable optical sub-assemblies to be connected to the printed circuit board in optical transceiver modules in a reliable and inexpensive manner. The use of such lead frame connectors eliminates the need for flexible printed circuit boards that have been used in conventional transceiver modules.

According to one embodiment, the lead frame connector includes a stamped and bent conductive lead structure that is encased within an insert injection molded plastic casing. The plastic casing provides electrical insulation for the conductors in the lead frame as well as mechanical support for the finished component. The lead frame connectors connect to the leads associated with the optical sub-assemblies. The lead frame connectors also can be surface mounted onto the printed circuit board to establish connectivity between the optical sub-assembly and the printed circuit board. The lead frame connectors can be adapted for use with transmitter optical sub-assemblies and receiver optical sub-assemblies, and can have any necessary number of leads.

The lead frame connectors can be manufactured using a reel-to-reel insert injection molding process. This process includes a step of stamping the appropriate conductor structure and configuration in a ribbon of conductive material. The stamped ribbon is spooled from one reel to another while being passed through the insert injection molding process. During this process, the conductors of the stamped ribbon are bent or manipulated as needed in three dimensions to achieve the necessary three-dimensional conductor configuration. The molding process forms the plastic casing that provides mechanical support and electrical isolation for the conductors.

After the plastic casing if formed, the lead frame assembly is passed through a singulation die that dices the ribbon into individual lead frame assemblies. After singulation, the individual leads of the encased conductive structure can be separated one from another by punching out a connecting central structure that holds the various leads together during the preceding molding process. This technique reduces the size of the conductive stubs that might otherwise exist and would degrade the RF response of the lead frame connector.

The foregoing, together with other features and advantages of the present invention, will become more apparent when referred to the following specification, claims and accompanying drawings.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 2a further illustrates the ROSA lead frame connector of FIG. 1a.

FIGS. 2c-2f illustrates various views of the ROSA lead frame connector of FIG. 1a.

DETAILED DESCRIPTION OF THE PREFERRED EMBODIMENTS

The present invention relates to lead frame connectors that are used to electrically and mechanically connect optical sub-assemblies to printed circuit boards in optical transceiver modules. According to one embodiment, the lead frame connector is fabricated using an insert injection molding process applied to a reel-to-reel stamped lead frame ribbon. The lead frame connectors connect to the leads associated with the optical sub-assemblies. The lead frame connectors also can be surface mounted onto the printed circuit board to establish connectivity between the optical sub-assembly and the printed circuit board.

The lead frame connectors of the invention provide several advantages compared to the use of flex circuits or other conventional techniques. Compared to flex circuits, the lead frame connector components are significantly less expensive. In addition, the process of manufacturing a transceiver module using lead frame connectors is more automated and requires less labor. Compared to simply bending the leads of the optical sub-assemblies to permit direct connection to a PCB, the lead frame connectors have significantly better electrical performance and RF response. Moreover, there is no significant risk of damaging the fragile portions of the optical sub-assemblies during the process of connecting the optical sub-assemblies to the PCB.

1. Lead Frame Connector Structure

Figures 1A, 1B:
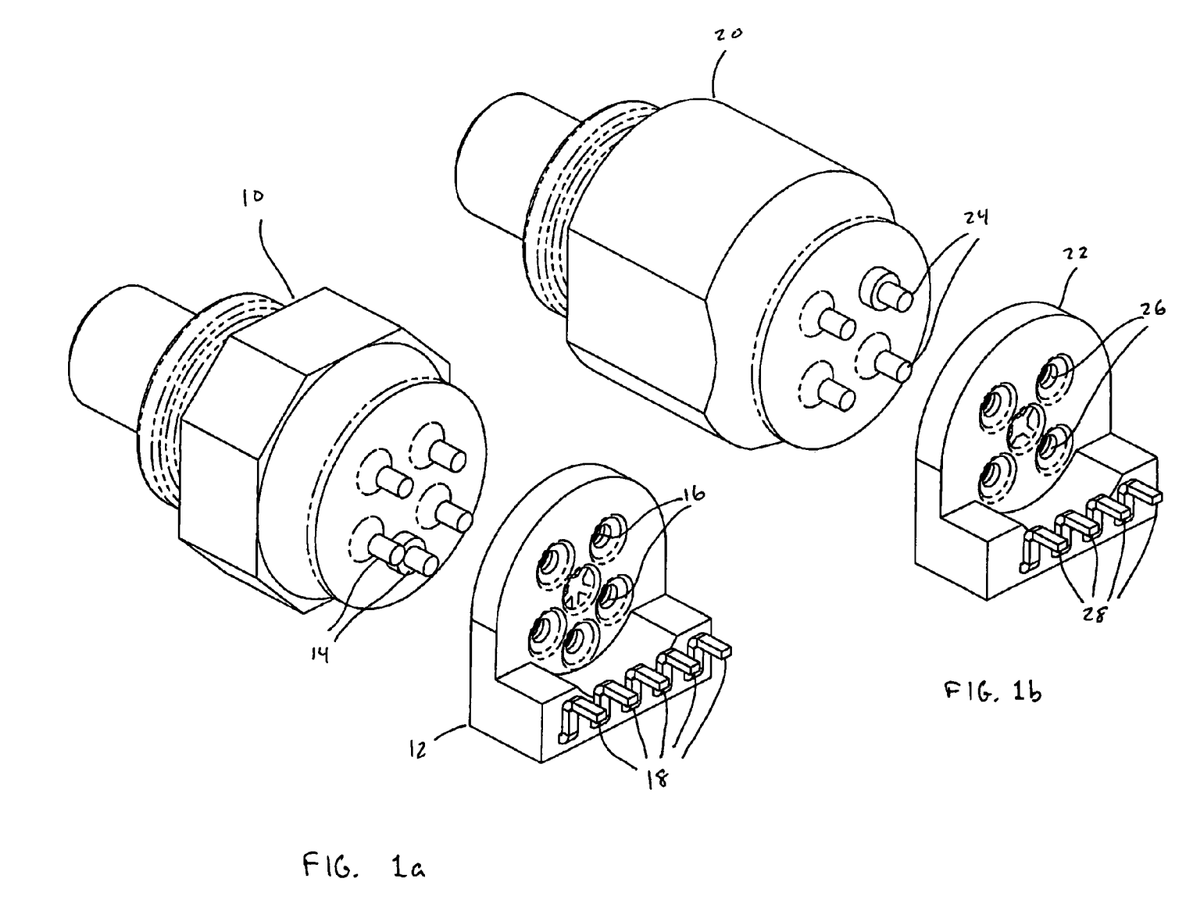
FIG. 1a illustrates a ROSA and a corresponding lead frame connector that is constructed according to an embodiment the invention.
FIG. 1b illustrates a TOSA and a corresponding lead frame connector that is constructed according to an embodiment of the invention.

FIG. 1a illustrates a ROSA 10 and a corresponding lead frame connector 12 that is constructed according to an embodiment the invention. ROSAs typically have five leads 14, and the lead frame connector 14 of FIG. 1a has five corresponding electrical contacts 16 and leads 18. FIG. 1b illustrates a TOSA 20 and a corresponding lead frame connector 22 that is constructed according to an embodiment of the invention. TOSAs typically have four leads 24, and the lead frame connector 22 of FIG. 1b has four corresponding electrical contacts 26 and leads 28. Although the lead frame connectors of FIGS. 1a and 1b are shown with four and five electrical contacts and leads, respectively, the principles of the invention disclosed herein can be applied to form lead frame connectors that have substantially any number of required electrical contacts and leads.

FIGS. 2a-2g and 3a-3g show various views of the lead frame connectors 12 and 22 of FIGS. 1a and 1b. U.S. Pat. No. 7,097,468, entitled "Lead Frame for Connecting Optical Sub-Assembly to Printed Circuit Board," filed on the same day as the present application, is incorporated herein by reference and includes additional details of the structural features and electrical performance of the lead frame connectors illustrated in the drawings that accompany the present patent application.

2. Lead Frame Connector Fabrication Process

One of the advantages of the lead frame connectors of the invention is that they can have manufacturing costs that are much lower than the costs of manufacturing flex circuits that have conventionally been used in optical transceiver modules. In addition to the lead frame connectors themselves, the embodiments of the invention also extend to methods of manufacturing the lead frame connectors.

According to one embodiment, the method of manufacturing lead frame connectors 12 and 22 is performed using a reel-to-reel insert injection molding process. Reel-to-reel insert injection molding processes are known generally in the art, but have not previously been applied to the manufacture of connectors that can be used to connect optical sub-assemblies to printed circuit boards of optical transceiver modules.

Figure 5A:
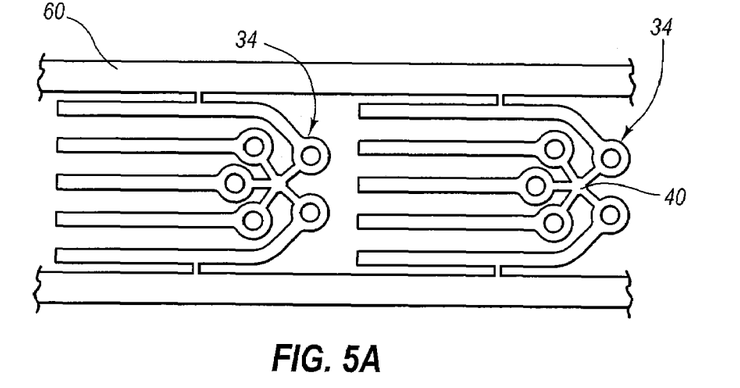
FIGS. 5a and 5b illustrate possible ribbon configurations of a conductive material and FIG. 6 illustrates a system for manufacturing individual lead frame assemblies.
Figure 5B:
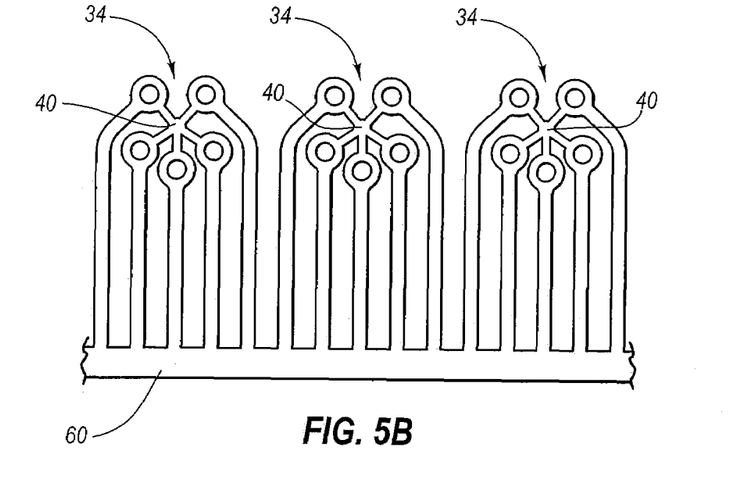

The process of manufacturing the lead frame connector includes a step of stamping the appropriate conductor structure and configuration in a ribbon of conductive material. For example, the general conductor configuration 34 shown in FIGS. 2b and 3b can be formed by stamping a copper ribbon, shown at 60 in FIGS. 5A and 5B, which figures depict two possible ribbon configurations. The conductor configuration can be easily selected to conform with the conductor design that has been determined to have acceptable electrical performance as described above.

Figure 6:
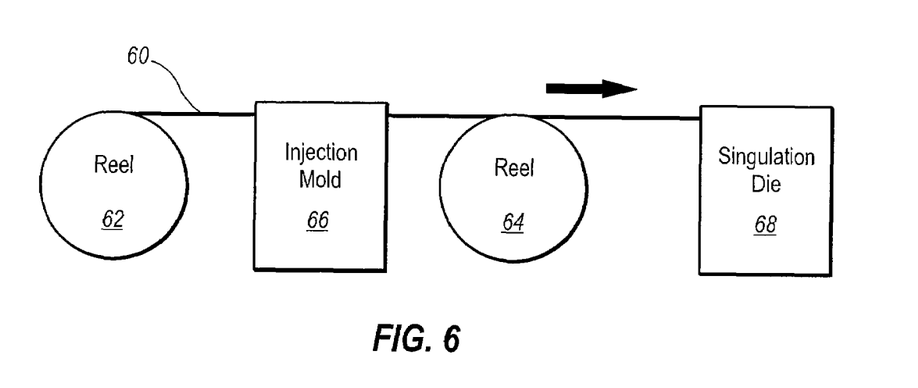

The stamped ribbon is spooled from one reel 62 to another reel 64, as shown in FIG. 6, while being passed through the insert injection molding process. During this process, the conductors 34 of the stamped ribbon 60 are bent or manipulated as needed in three dimensions as shown, for example, in FIGS. 2b and 3b, to achieve the necessary three-dimensional conductor configuration. The insert injection molding process by injection mold 66 forms the plastic casing about the lead frame, which provides mechanical support and electrical isolation for the conductors.

After the plastic casing 32 is formed, the lead frame assembly is passed through a singulation die 68 that dices the ribbon into individual lead frame assemblies. During the preceding insert injection molding process, the individual conductors in the lead frame are held together using a portion of the lead frame. In general, lead frame manufacturing processes use a portion of the lead frame structure to mechanically stabilize the individual conductors during the stamping and molding process. Conventional lead frame manufacturing processes typically use external stabilization, meaning that the individual conductors are typically stabilized and connected to an external support structure that is sheared off during the singulation stage. One problem associated with stabilization and singulation in this manner is that conductive stubs often remain in electrical contact with the leads after this step. Sizeable stubs can act as antennas and degrade the RF response of the lead frame structure.

Figure 2A:
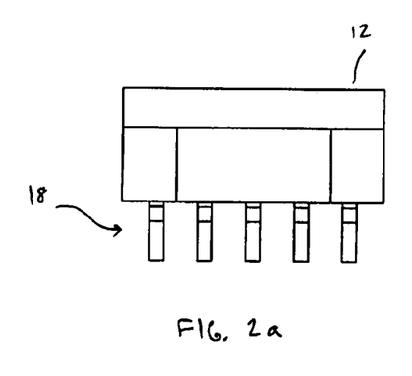
Figure 2B:
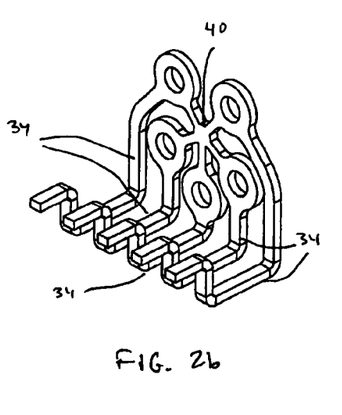
FIG. 2b illustrates a stamped and bent lead frame without the plastic casing that is insert injection molded around the lead frame.
Figure 2C:
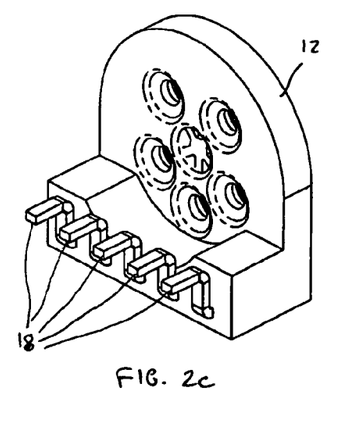
Figure 2D:
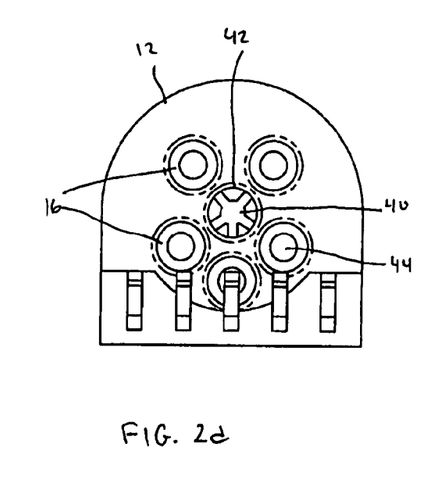
Figure 2E:
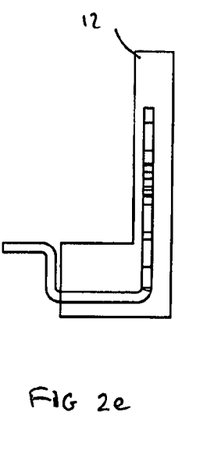
Figure 2F:
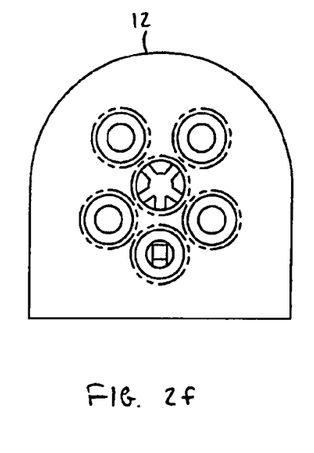
Figure 3A:
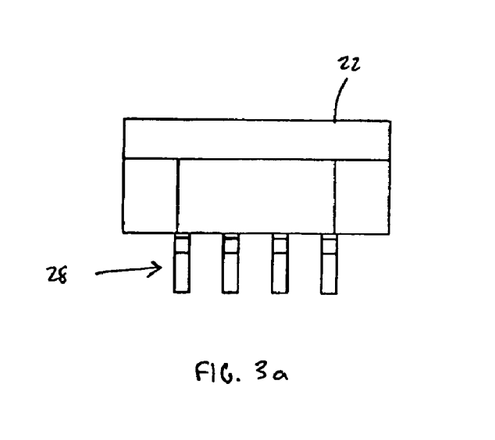
FIG. 3a further illustrates the TOSA lead frame connector of FIG. 1b.
Figure 3B:
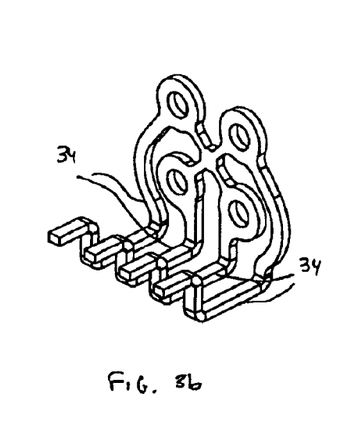
FIG. 3b illustrates a stamped and bent lead frame without the plastic casing that is insert injection molded around the lead frame.
Figure 3C:
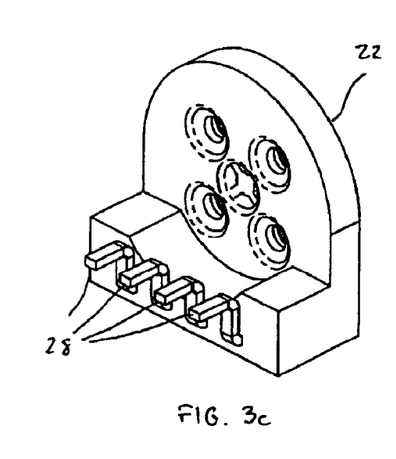
FIGS. 3c-3f illustrates various views of the TOSA lead frame connector of FIG. 1b.
Figure 3D:
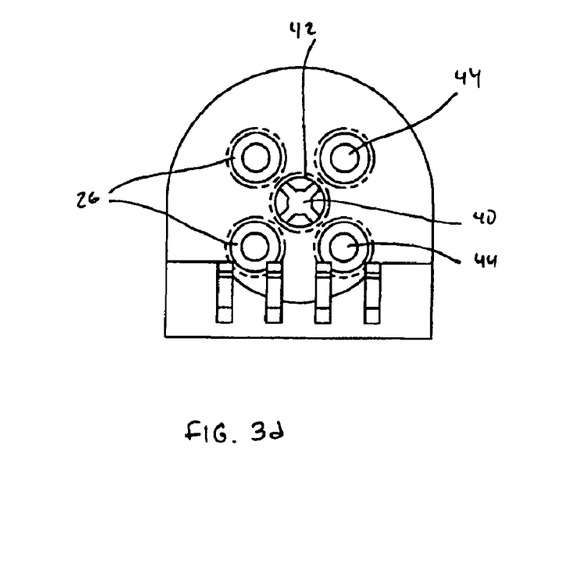
Figures 3E, 3F:
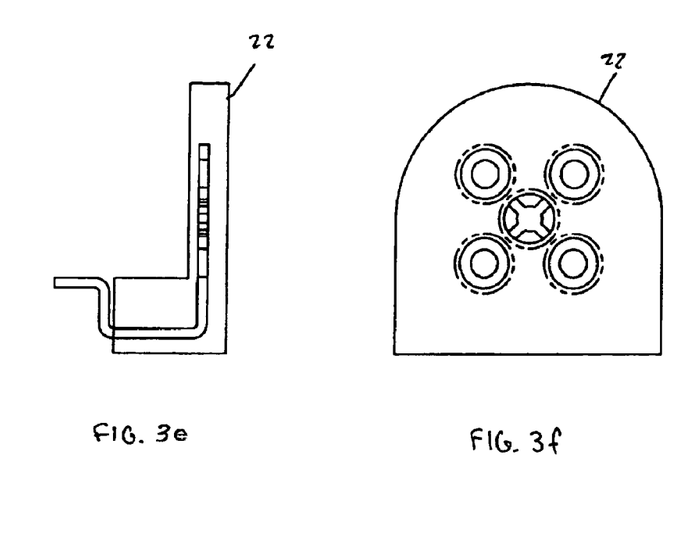

According to one embodiment of the invention, relatively large stubs are avoided by using an internal stabilization process illustrated in FIGS. 2b, 2d, 3b and 3d. The process is generally similar for both the TOSA and ROSA connectors, and the details are discussed herein in reference to the ROSA connector of FIGS. 2b and 2d. In particular, the five individual conductors of FIG. 2b are connected centrally one to another with a "starburst" conductive structure 40 in a way that provides mechanical stabilization during the molding process. This structure 40 is in contrast to external stabilization structures that have typically been used in lead frame molding processes. After the molding process is complete, the conductive starburst structure 40 is punched out through a central, or isolating, hole 42 shown in FIG. 2d. This punching operation removes most of the conductive material that had stabilized the conductors and serves to electrically separate the conductors one from another. This operation also leave only negligible stubs that do not significantly degrade the RF response, even at high frequencies, such as 1, 2, 4 or 10 Gbits/second or higher.

3. Transceiver Manufacturing Process Using Lead Frame Connectors

Figures 4A, 4B:
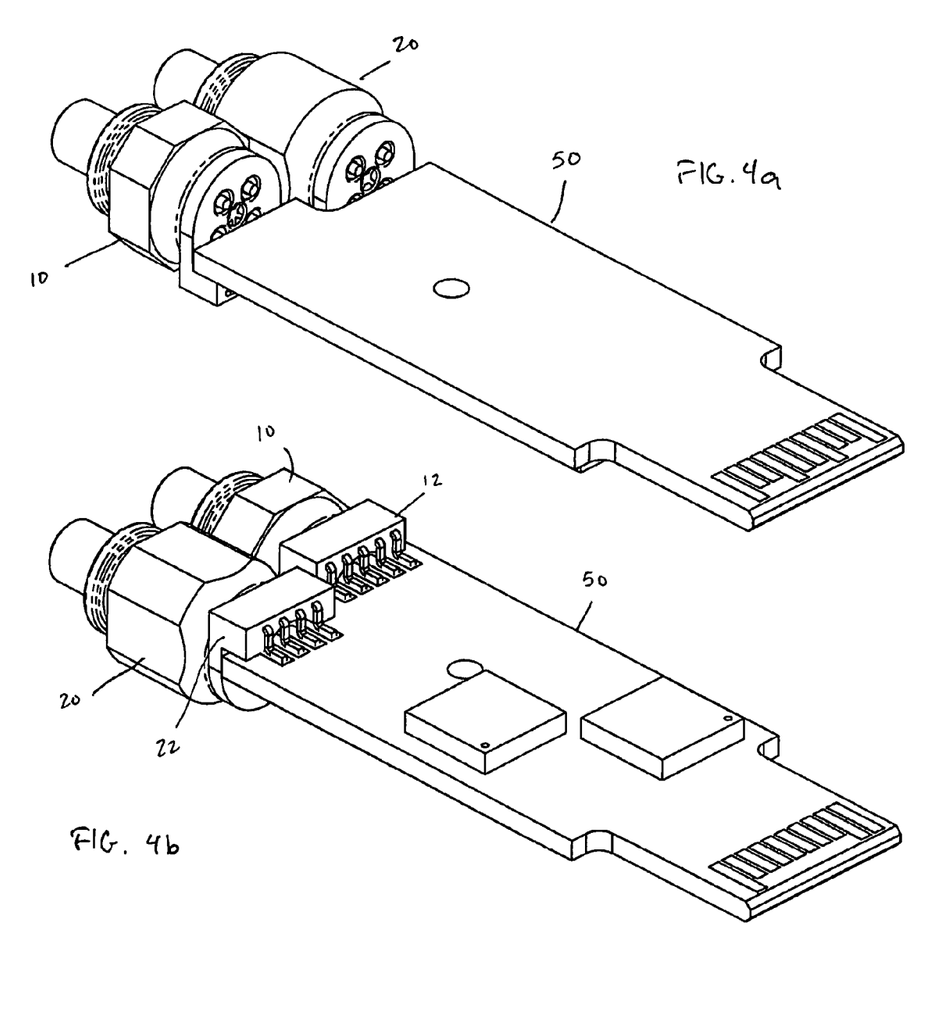
FIGS. 4a and 4b are perspective views of opposite sides of a printed circuit board that has lead frame connectors attached thereto.

FIGS. 4a and 4b illustrate opposite sides of a printed circuit board 50 that has lead frame connectors 12 and 22 attached thereto. The invention disclosed herein also extends to methods of manufacturing or assembling optical transceiver modules using the lead frame connectors 12 and 22. U.S. Pat. No. 7,097,468, entitled "Methods for Manufacturing Optical Modules Using Lead Frame Connectors," filed on the same day as the present application, is incorporated herein by reference and includes additional details regarding the methods of manufacturing optical transceiver modules.

As noted in the foregoing patent application, according to certain embodiments of the invention, the process of connecting the combined ROSA 10 or TOSA 20 and lead frame connector 12 to the PCB 50 does not require epoxy reinforcement and avoids alignment handling issues that have been experienced in conventional methods of connecting optical sub-assemblies to PCBs using, for instance, flex circuits.

The present invention may be embodied in other specific forms without departing from its spirit or essential characteristics. The described embodiments are to be considered in all respects only as illustrative and not restrictive.

I claim:

1. A method of manufacturing lead frame connectors for use in connecting an optical sub-assembly to a printed circuit board of an optical transceiver module, comprising:
    stamping a selected configuration of conductors in a conductive ribbon, wherein conductors in the configuration of conductors that correspond to individual lead frame connectors are internally stabilized using a conductive structure prior to singulation;
    passing the conductive ribbon through an insert injection molding process to form an insulating casing around the conductors; and
    singulating the conductive ribbon into individual lead frame connectors having:
        a plurality of electrical contacts that are configured for connection with leads of the optical sub-assembly; and
        a plurality of leads that are configured for connection with conductive features on the printed circuit board; and
    punching the conductive structure from each individual lead frame connector.

2. The method as defined in claim 1, further comprising punching the conductive structure from the lead frame connector through a hole formed in the insulating casing.

3. The method as defined in claim 2, wherein punching the conductive structure from the lead frame connector forming the hole in the electrically insulating casing during the insert injection molding process.

4. The method as defined in claim 1, wherein passing the conductive ribbon through an insert injection molding process comprises passing the conductive ribbon from one reel to another reel.

5. The method as defined in claim 1, further comprising, prior to passing the conductive ribbon through the insert injection molding process, bending the conductors of the conductive ribbon such that the plurality of leads are oriented in a direction that is not parallel to a plane defined by the plurality of electrical contacts.

6. The method as defined in claim 1, further comprising connecting an optical sub-assembly to a printed circuit board of an optical transceiver module using the lead frame connector.

7. The method as defined in claim 6, wherein connecting the optical sub-assembly to the printed circuit board comprises:
    connecting the plurality of electrical contacts of the lead frame connector to corresponding leads of the optical sub-assembly to obtain a combined structure that includes the lead frame connector and the optical sub-assembly; and
    connecting the plurality of leads of the lead frame connector to corresponding conductive features on the printed circuit board.

8. The method as defined in claim 7, wherein the optical sub-assembly is a transmitter optical sub-assembly.

9. The method as defined in claim 7, wherein the optical sub-assembly is a receiver optical sub-assembly.

10. The method as defined in claim 1, wherein the selected configuration of conductors is selected to achieve a desired RF response of the lead frame connector when used in the optical transceiver module.

11. A method of manufacturing lead frame connectors for use in connecting an optical sub-assembly to a printed circuit board of an optical transceiver module, comprising:
    stamping a selected configuration of conductors in a conductive ribbon;

passing the conductive ribbon through an insert injection molding process, wherein passing the conductive ribbon through an insert injection molding process comprises passing the conductive ribbon from one reel to another reel; and singulating the conductive ribbon into individual lead frame connectors having:
- a plurality of electrical contacts that are configured for connection with leads of the optical sub-assembly; and
- a plurality of leads that are configured for connection with conductive features on the printed circuit board.

12. The method of claim 11, wherein passing the conductive ribbon through an insert injection molding process form an insulating casing around a portion of the selected configuration of conductors, wherein a hole is formed in the insulating casing.

13. The method of claim 12, further comprising punching a conductive feature from the selected configuration of conductors, the conductive feature providing internal stabilization to the selected configuration of conductors during the insert injection molding process.

* * * * *

UNITED STATES PATENT AND TRADEMARK OFFICE
CERTIFICATE OF CORRECTION

PATENT NO. : 7,370,414 B2
APPLICATION NO. : 10/810041
DATED : May 13, 2008
INVENTOR(S) : Donald A. Ice Page 1 of 1

It is certified that error appears in the above-identified patent and that said Letters Patent is hereby corrected as shown below:

Column 4
Line 13, change "lead frame connector 14" to --lead frame connector 12--
Line 20, change "with four" to --with five--
Line 21, change "and five" to --and four--

Column 5
Line 4, change "casing 32 is" to --casing is--
Line 7, change "injection molding process" to --injection molding process 66--
Line 57, change "connector 12 to the PCB 50" to --connector 12 or 22 to the PCB 50--

Signed and Sealed this

Thirtieth Day of March, 2010

David J. Kappos
*Director of the United States Patent and Trademark Office*